United States Patent [19]

Lin et al.

[11] Patent Number: 4,837,184

[45] Date of Patent: Jun. 6, 1989

[54] PROCESS OF MAKING AN ELECTRONIC DEVICE PACKAGE WITH PERIPHERAL CARRIER STRUCTURE OF LOW-COST PLASTIC

[75] Inventors: Paul T. Lin; Michael B. McShane; Charles G. Bigler, all of Austin; John A. Goertz, Red Rock, all of Tex.

[73] Assignee: Motorola Inc., Schaumburg, Ill.

[21] Appl. No.: 141,013

[22] Filed: Jan. 4, 1988

[51] Int. Cl.⁴ ............................................. H01L 21/66
[52] U.S. Cl. ................................ 437/217; 264/272.11; 29/856; 206/328; 357/74
[58] Field of Search ........................ 437/207, 217, 180; 264/272.11; 29/856; 206/328

[56] References Cited

U.S. PATENT DOCUMENTS

| | | | |
|---|---|---|---|
| 3,267,335 | 8/1966 | Walkow | 317/101 |
| 4,102,039 | 7/1978 | Hendrickson et al. | 29/593 |
| 4,701,781 | 10/1987 | Sankhagowit | 357/70 |

Primary Examiner—Brian E. Hearn
Assistant Examiner—Beverly A. Pawlikowski
Attorney, Agent, or Firm—John A. Fisher

[57] ABSTRACT

An electronic device package on a lead frame with a peripheral carrier structure holding the distal ends of the leads in rigid position. The carrier structure is spaced apart from the package body and permits the package to be handled and tested while protecting the leads. A different, relatively lower quality and less expensive material is used for the carrier structure than for the package body to reduce the cost of the package since the carrier structure may comprise several times, for example four times or more, the volume of the package body.

19 Claims, 3 Drawing Sheets

PROCESS OF MAKING AN ELECTRONIC DEVICE PACKAGE WITH PERIPHERAL CARRIER STRUCTURE OF LOW-COST PLASTIC

FIELD OF THE INVENTION

The invention relates to packages and structures to hold electronic components, and more particularly relates to plastic encapsulations of electronic packages.

BACKGROUND OF THE INVENTION

Many types of packages are known for electronic components, particularly integrated circuits. Typically, integrated circuits are packaged in structures that consist of the integrated circuit chip bonded to leads, where the chip and the inner portions of the leads are surrounded or encapsulated by a material forming the package body from which the outer ends of the leads protrude. The exposed leads permit the packaged component to be mounted to a printed circuit (PC) board, or in a fixture or socket, or other connecting system.

Conventionally, the material of the package body is made from pre-formed parts, such as ceramic and occasionally metal, which are then heremetically bonded around the chip, or the material is a plastic and is cast around the chip and the inner portion of the leads in a plastic injection and transfer molding operation. The plastic package is usually not heremetic. Some research is also being conducted in premolding plastic body parts which are then adhesively secured around the integrated circuit in a fashion similar to that of ceramic packages. While ceramic packages are of a higher quality than plastic packages, and more secure from invasion by outside elements such as moisture, they are also more expensive than the plastic packages.

Another issue in packaging electronic components such as integrated circuits, is the material of the leads. Traditionally, lead frames for packages are relatively thick, of about 5 to 10 mils and the electrical connection from the bonding pads of the integrated circuit to the inner ends of the lead frame are made by very thin wire bonds. In recent years, considerable interest has been generated by using thin foil lead frames or tape, often backed by a layer of polyimide or other plastic. Sometimes the tape has three layers. The advantage of a tape lead frame is that the lead frames can take the form of windows on strips, much like the frames on photographic film, and the bonding process can be automated at high speed to provide a tape automated bonding (TAB) process. The thin tape lead frames typically have a thickness of 1 to 3 mils which permits the package to be made smaller.

Electronic packages using the above described technologies take many forms. One popular form is the dual in-line package or DIP which consists of an elongated package body with leads extending from and turning down on both sides of the package body. Another form is the plastic leaded chip carrier (PLCC) which involves a flat, rectangular or square package body with leads extending from and turning down along all of the four sides of the package body. The ends of the leads may also be configured differently, such as elongated with standoff shoulders for through-hole mounting, or J-lead, gull wing or butt joint for surface mounting.

It is well known that there is constant pressure to provide integrated circuits with higher complexity in smaller packages. This causes the development of DIPs and PLCCs and other packages with very high pin or lead counts where the package itself is very small. Such packages have leads that tend to be fragile and difficult to handle. Often the leads of the package are easily bent. It will be appreciated that TAB technology is employed to solve some of the size requirements, but the thinner leads are even more fragile than leads made using conventional lead frames.

Another requirement of integrated circuit packages is that they must be tested before they are sold to a customer. The handling involved in moving and testing the packages provides additional opportunity for the leads to be damaged. Further, test equipment, particularly test sites must be devised for each type of package that contains a different number of leads or leads on a different spacing or pitch. Another problem is that a package with leads spaced on a mil system cannot be tested on a tester with metric spaced contacts.

One solution to some of these problems for encapsulated plastic ICs employs a carrier frame. First, a semiconductor die is connected in a die-attach aperture of a copper foil tape. Die contact pads are bonded to the inner ends of interconnected finger contacts on the tape. The finger contacts etched in the foil include splayed out portions extending to probe ends. There are interconnect cross-links that initially connect the finger contacts and the tape edges and function as dam bars in subsequent encapsulation. The die and die bonds are mold encapsulated to form the die package, but also a carrier frame is simultaneously molded around and spaced from the periphery of the die package. The probe ends are exposed within a slot in the frame or extend from the ends of the frame so that probe tips can be pressed thereon to test the die and its bonds. Prior to testing, the interconnects exposed in the annulus between the package and the carrier are blanked out so that each finger leading from a die contact pad becomes discrete, that is, no longer interconnected to an adjoining finger, so that testing of each die contact and bond can be done. The stiff, molded carrier frame acts to support the probe ends of the fingers and protects and stiffens the foil tape for the testing operations and for shipping and handling purposes. When the package is ready to be mounted, the carrier frame and probe ends are sheared away and discarded and the remaining portions of the fingers are formed into leads to be interconnected to a system, such as on a PC board.

This solution only contemplates that the die package and the carrier frame be molded at the same time using the same encapsulant. Only high quality, thermoset plastics are used in electronic packages. Thus, one problem with this proposed solution is that the volume of the carrier frame is several times, for example, four times, that of the die package, and considerable relatively high quality, expensive plastic is discarded when the carrier frame is sheared off.

SUMMARY OF THE INVENTION

Accordingly, it is an object of the present invention to provide a package for electronic devices having a large plurality of fine leads or pins that permits safe handling of the package with little risk of damage to the leads.

It is another object of the present invention to provide a package for electronic devices that permits safe handling of the package which is economical.

Another object of the present invention is to provide an electronic device package that enables the device to be tested while in a protected state before the leads are finally formed.

In carrying out these and other objects of the invention, there is provided, in one form, an electronic device package having a carrier structure. The package has a lead frame with a plurality of leads peripherally surrounding an electronic element bonding area. Each lead has a proximal end near the bonding area, a distal end away from the bonding area and an intermediate portion between the proximal end and the distal end. An electronic element is bonded to the proximal ends of leads in the lead frame. A package body exists over the electronic element and at least a portion of the proximal ends of each of the leads, the package body being of a first material. A carrier structure is present over at least a portion of the distal ends of at least some of the leads; the carrier structure being of a second material different from the first material. At least a portion of the intermediate portions of the leads are exposed and not covered by either material.

DETAILED DESCRIPTION OF THE INVENTION

Figure 1:
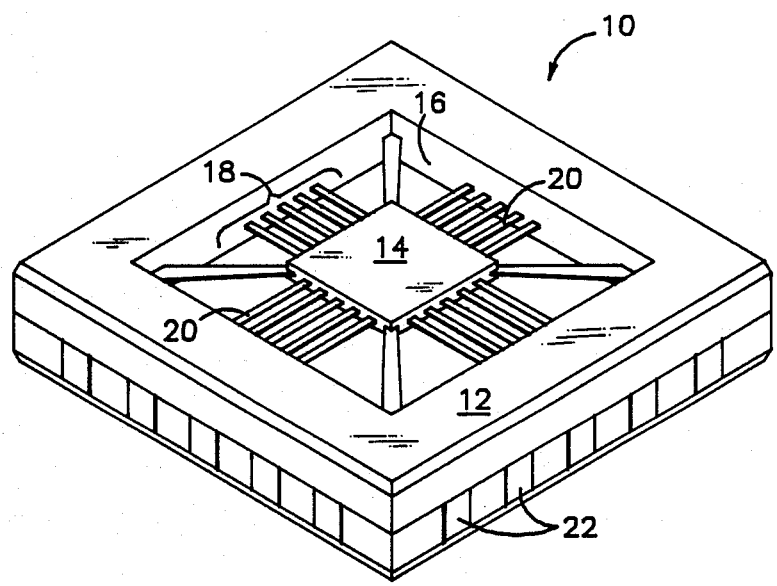
FIG. 1 is a three-quarters view of an electronic device package of this invention after assembly but before the carrier structure is excised.

Shown in FIG. 1 is one version of the electronic device package 10 of this invention after molding but before the excising of the carrier structure 12 that surrounds the package body 14. Note that carrier structure 12 is spaced apart from package body 14 by opening 16 which exposes leads 18, specifically the intermediate portions 20 thereof. Distal ends 22 of the leads 18 are seen around the perimeter of the carrier structure 12. It is apparent that package 10 can be handled by means of the carrier structure 12 minimizing contact with package body 14. The package 10 shown in FIG. 1 can be tested by means of the distal ends 22 of the leads or the intermediate portions 20. It is also apparent, however, that the volume of carrier ring 12 is considerably larger than that of the package body 14 and that appreciable material is wasted when carrier ring 12 is cut away and discarded. The exact amount of expensive plastic discarded depends on the dimensions of the ring.

The invention concerns providing carrier ring 12 out of a different material than that of package body 14. For example, carrier structure 12 could be fabricated out of a relatively inexpensive thermoplastic or thermoset plastic, whereas the package body 14 is provided from a material necessary to withstand the rigors of use, for example, a high-quality engineering plastic. Such high quality materials may be low ionic, low alpha content materials or be plastics that require special filler materials.

However, in another version, the carrier ring 12 may be made from a higher quality material than the package body 14. For example, in the case of a ceramic ring and a plastic body. The ceramic ring need only have one layer, such as a base or a cap that is sealed in place with glass, whereas the package body may be formed from premolded, high quality plastic. In another example, the carrier structure could be designed to be reusable, and thus made of a high quality material, whereas the package body could be a different, injection molded material.

As one example of how the materials can be different, consider that typically the plastic for the package body 14 has a dye or colorant added for cosmetic reasons or to make the package opaque to certain or most frequencies of radiation. A particularly common color is black. Most plastics without a colorant or pigment are clear or semitransparent light yellow. However, there is no reason why a colorant need be used in carrier structure 12, and thus the cost of the plastic used therein can be reduced further.

The material for the carrier structure 12 may be optimized for other different properties than the material for the package body 14. For example, in one version, a plastic for use on the package body is optimized to relieve stress on the electronic device 32, whereas the carrier structure 12 may be optimized to minimize lead distortion, for example, using a plastic with little or no shrinkage to preserve the flatness of the lead frame 26.

Examples of a high-quality plastics suitable for use as a package body include NITTO 180 or HYSOL MG 36F or an electronic grade epoxy transfer mold compound. These are materials that are low alpha particle producers. Low viscosity plastics are also preferred. Examples of relatively lower quality plastics that are more appropriate for the carrier ring material include the various forms of polyethylene, polypropylene, polystyrene, ABS resins, thermoplastic elastomers, phenolic injection molding compounds, among other materials.

The interior structure of the electronic device package 10 will be described in more detail with reference to FIG. 5. Electronic device package 24 shown therein has a lead frame 26 comprising a plurality of leads 18 peripherally surrounding an electronic element bonding area 28. This lead frame 26 may be of conventional, relatively thick metal or thinner tape or even a combination of the two. Each lead has a proximal end 30 near the bonding area 28, a distal end 22 away from the bonding area 28 and an intermediate portion 20 between the proximal end 30 and the distal end 22. It is apparent that leads 18 generally flare outward in direction and width from their proximal ends 30 to their distal ends 22. This flaring or splaying permits the spacing of the bonding pads on integrated circuit chip 32, the intermediate portions 20 (which eventually form the leads of the package) and the distal ends 22 to be of different sizes and of different pitches. For example, the spacing of distal ends 22, which may optionally include a peripheral testing pad 34, may be a standardized size and pitch, thereby permitting a variety of different kinds of packages with different numbers and pitches of leads to be tested by the same piece of equipment.

Leads 18 are typically held in relative position during assembly by interconnects or dam bars in places such as between the intermediate portions 20 of the leads 20, or between the peripheral testing pads 34, such as in a frame configuration around the entire frame 26. Polyimide tape may also be used to hold the leads in relative position. Such interconnections, which are not shown and are not a critical part of the invention, must be in a configuration where they can be sheared or cut away before testing of the device 32 to prevent shorting of the discrete leads 18.

The footprint 36 of the carrier structure 38 is shown superimposed on the lead frame 26 to indicate that peripheral testing pads 34 remain outside the carrier structure for testing purposes. Carrier structure 38 is composed of upper portion 40 or lower portion 42 or both as premolded portions adhesively or thermally attached to the lead frame 26 at a different time or simultaneously with the providing of cap 44 and base 46 adhesively or thermally sealed to form the package body. Again, the quality and properties of the material and the seal of upper and lower portions 40 and 42 may be appreciably different or less expensive than the material of base 46 and cap 44. A die coat material may be applied inside the premolded cap 44 and base 46 of the package body. Base 46 and cap 44 of the package body may be even by a ceramic material if the method for sealing the base 46 and cap 44 is purely adhesive or is achieved at a low temperature so as to not damage the carrier structure 38, or is performed at a customarily high temperature prior to the formation of carrier structure 38.

Figure 2:
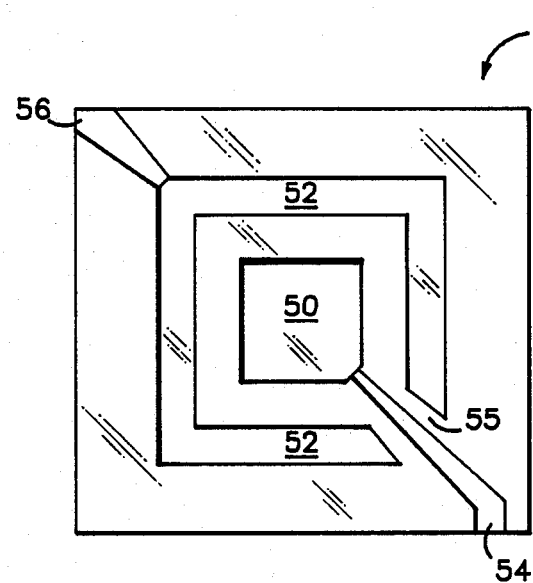
FIG. 2 is a simplified overhead view of a mold that may be used in one form of the present invention.

The electronic device package 10 of FIG. 1 may be achieved also by injection molding as is customarily used for the majority of plastic packages using a mold 48 such as shown in FIG. 2. Mold 48, carefully machined from metal, contains a mold cavity 50 for the package body and mold cavity 52 for the carrier structure. While it is possible to devise a mold that permits the carrier structure to have a closed ring configuration as seen in FIG. 1, such a mold would be considerably more expensive to fabricate than a mold 48 where the cavities 50 and 52 are coplanar. Cavities 50 and 52 must have gates to permit the mold material to enter the cavities 50 and 52 and it is difficult to machine a gate to an element inside a closed ring. However, cavity 52 may be cut to form an opening 55 at some point to permit the gate 54 of cavity 50 to access it. Separate gate 56 would supply a second, less expensive, thermoplastic or thermoset material to cavity 52.

Figure 3:
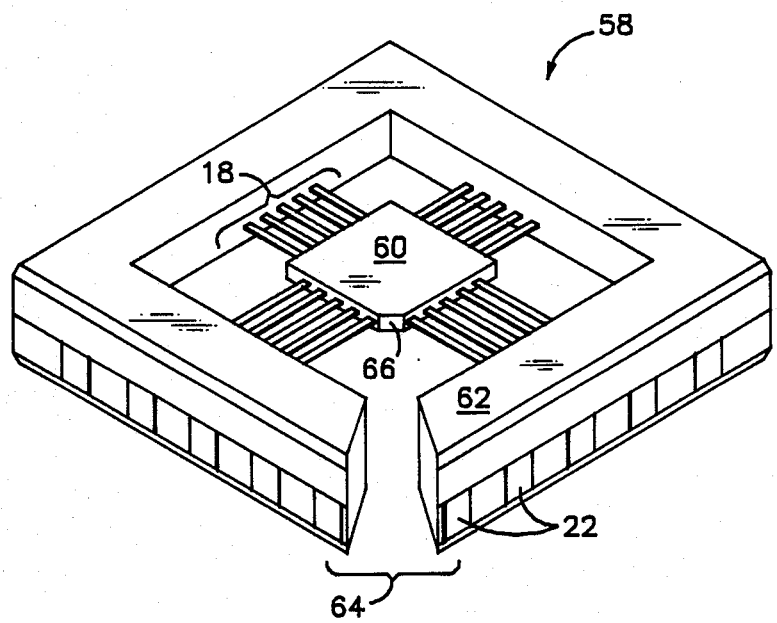
FIG. 3 is a three-quarters view of the electronic device package embodiment of this invention made using the mold of FIG. 2.

The package 58 that would be produced by mold 48 is shown in FIG. 3 and has a package body 60 surrounded by carrier structure 62. Carrier structure 62 has a gap 64 that was necessitated to permit gate 54 to deliver plastic to form package body 60. Of course, the leftover plastic in gates 54 and 56 is excised from package body 60 and carrier structure 62, respectively. The beveled surface 66 formed after the leftover plastic from gate 54 is removed may serve as a notch for registration, for example in an automated assembly line. Likewise, the gap 64 may serve to register the entire package 58, for example, as in an automated testing procedure.

While the carrier structure 62 may not be as rigid as the full ring structure 12 shown in package 10 of FIG. 1, is nevertheless provides sufficient strength and rigidity to prevent damage to and relative movement of leads 18.

It is also contemplated that in the case of encapsulating the die 32 and the leadframe 26 that the provision of the package body 60 and carrier structure 62 of split or ring-shape may be done in separate encapsulation steps, rather than simultaneously as described above. While this sequential procedure would be more expensive than performing both molding operations simultaneously, the savings in using a less expensive material for the carrier structure could be expected to compensate for the additional expense.

Figure 5:
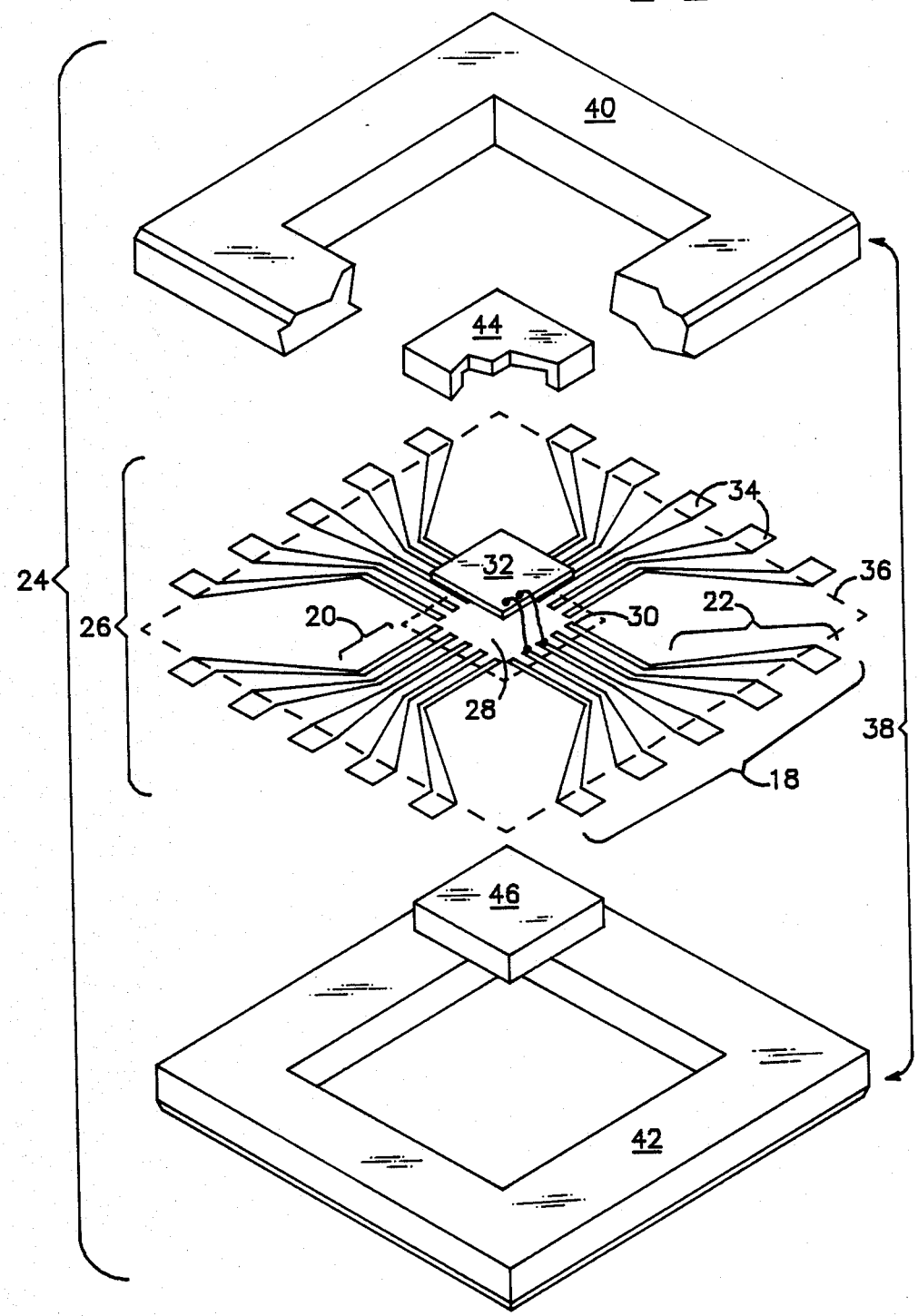
FIG. 5 is a three-quarters exploded view of another alternate version of the present invention.

In yet another form of the invention, the package 24 of FIG. 5 could be modified to require only the premolded upper portion 40 or only the premolded lower portion 42 as the carrier structure 38. Since the leads 18 are only temporarily housed by the carrier structure 38, there is no need for the distal ends 22 to be completely encapsulated. However, it will be appreciated that another form of the invention contemplates that the distal ends 22 of the leads 18 may be completely encapsulated. In such a case, the intermediate portions 20 would be the portions of the leads 18 contacted for test purposes.

Figure 4:
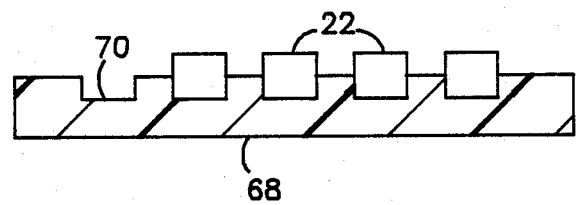
FIG. 4 is a section view of the distal ends of a lead frame mated with the carrier structure of an alternate version of the package of this invention.

In such an arrangement shown in FIG. 4, the carrier structure 68 may be provided with grooves or slots 70 to accomodate the distal ends 22 of leads 18. Distal ends 22 of the lead frame 26 would be adhesively or thermally attached to the carrier structure 68 as shown in cross section in FIG. 4. It is even contemplated that the tolerances of the width of the grooves 70 and the leads 18 could be designed in such a way as to permit leads 18 to be simply press-fitted into the slots 70. With suitable assembly and removal equipment, such carrier structures 68 could be removed and reused for a multiplicity of packages. The removal of the press-fit carrier structures 68 could be performed after the excising of the dam bars/interconnects between the leads 18 and testing and just prior to the formation of the leads close to the package body.

It will be appreciated that the use of a carrier structure in a ring or split ring shape is arbitrary. Due to the customary structure of leads in a lead frame configuration around an electronic element bonding area, it is convenient for the carrier structure to surround the package body. However, it will be appreciated that the carrier structure could appear as other shapes. For example, the carrier structure could take the form of a rectangular strip on each of the four sides of a quadrilateral package covering only the leads on that side of the package. Since some integrated circuit die, such as memory die, often have bonding pads only on two sides of the die, the rectangular strip form of carrier structure may be particularly suitable for these forms of electronic element.

It will also be understood that while a number of permutations of the inventive method have been described, that others are possible within the scope of the invention depending on the exact final structure desired or the assembly method chosen. For example, Table I illustrates a number of different configurations for the package body and carrier structure and whether the provision of the package body and carrier structure would likely be a simultaneous or sequential operation. In the case of sequential operations, the sequence may not matter, or may depend on the temperature cycles required. For example, if a ceramic package body and a thermoplastic carrier structure were to be used in conjunction, it is anticipated that the ceramic package body should be formed first and the thermoplastic carrier structure formed subsequently since the higher temperatures to seal some ceramic packages would damage the thermoplastic carrier structure that would typically have a lower melting point.

TABLE I

| Different Package Configurations | | |
|---|---|---|
| Package Body | Carrier Structure | Method |
| Encapsulated Plastic | Encapsulated Plastic | Simultaneous or Sequential |
| Encapsulated | Premolded | Simultaneous or |

TABLE I-continued

| Different Package Configurations | | |
| --- | --- | --- |
| Package Body | Carrier Structure | Method |
| Plastic | Plastic | Sequential |
| Premolded | Encapsulated | Simultaenous or |
| Plastic | Plastic | Sequential |
| Premolded | Premolded | Simultaneous or |
| Plastic | Plastic | Sequential |
| Ceramic | Encapsulated or Premolded Plastic | Sequential |
| Plastic | Ceramic | Sequential |
| "Glob top" (non-molded) plastic or epoxy over die | Encapsulated or Premolded Plastic | Simultaneous or Sequential |

We claim:

1. A method for providing a packaged electronic device having a carrier structure comprising the steps of:
    providing a lead frame comprising a plurality of leads peripherally surrounding an electronic element bonding area, each lead having a proximal end near the bonding area, a distal end away from the bonding area and an intermediate portion between the proximal end and the distal end;
    bonding an electronic element to the proximal ends of leads in the lead frame;
    providing a package body over the electronic element and at least a portion of the proximal ends of each of the leads, the package body being a first material; and
    providing a carrier structure over and adherent to at least a portion of the distal ends of at least some of the leads, the carrier structure being of a second material different from the first material;
    at least a portion of the intermediate portions of the leads being exposed and not covered by either material.

2. The method of claim 1 wherein the step providing a package body of a first material provides a material of a first quality, and the step providing a carrier structure of a second material provides a material of a second quality, lower than said first quality.

3. The method of claim 1 wherein the steps of providing the package body and providing the carrier structure are performed separately in time.

4. The method of claim 1 wherein the steps of providing the package body and providing the carrier structure are performed simultaneously.

5. The method of claim 1 wherein the step providing the package body of the first material provides a first material selected from the group consisting of plastic and ceramic, and the step providing the carrier structure of the second material provides a second material of a plastic.

6. The method of claim 1 wherein the step of providing of a package body and the step of providing a carrier structure are plastic encapsulation steps.

7. The method of claim 6 wherein the step of providing a lead frame provides a lead frame where leads are coplanar, and wherein the step of providing a package body of the first material is performed by plastic encapsulation with a first mold cavity, and wherein the step of providing a carrier structure of the second material is performed by plastic encapsulation with a second mold cavity coplanar with the first mold cavity.

8. The method of claim 7 wherein the steps of providing a package body and a carrier structure by plastic encapsulation employing the first and second mold cavities having first and second gates, where the second mold cavity has an opening through which the first gate of the first mold cavity passes.

9. The method of claim 1 wherein the step of providing a carrier structure provides a carrier structure that at least partially encircles the package body.

10. A method for providing a packaged electronic device having a carrier structure comprising the steps of:
    providing a lead frame comprising a plurality of leads peripherally surrounding an electronic element bonding area, each lead having a proximal end near the bonding area, a distal end away from the bonding area and an intermediate portion between the proximal end and the distal end;
    bonding an electronic element to the proximal ends of leads in the lead frame;
    providing a package body over the electronic element and at least a portion of the proximal ends of each of the leads, the package body being a first relatively high quality material; and
    simultaneously with providing the package body, providing a carrier structure over and adherent to at least a portion of the distal ends of at least some of the leads, the carrier structure being of a second, relatively low quality material different from the first relatively high quality material;
    at least a portion of the intermediate portions of the leads being exposed and not covered by either material.

11. The method of claim 10 wherein the step providing the package body of the first material provides a first material selected from the group consisting of plastic and ceramic, and the step providing the carrier structure of the second material provides a second material of a plastic.

12. The method of claim 10 wherein the step of providing of a package body and the step of providing a carrier structure are plastic encapsulation steps.

13. The method of claim 12 wherein the step of providing a lead frame provides a lead frame where leads are coplanar, and wherein the step of providing a package body of the first material is performed by plastic encapsulation with a first mold cavity, and wherein the step of providing a carrier structure of the second material is performed by plastic encapsulation with a second mold cavity coplanar with the first mold cavity.

14. The method of claim 13 wherein the steps of providing a package body and a carrier structure by plastic encapsulation employing the first and second mold cavities having first and second gates, where the second mold cavity has an opening through which the first gate of the first mold cavity passes.

15. The method of claim 10 wherein the step of providing a carrier structure provides a carrier structure that at least partially encircles the package body.

16. A method for providing a packaged electronic device comprising the steps of:
    providing a lead frame comprising a plurality of leads peripherally surrounding an electronic element bonding area, each lead having a proximal end near the bonding area, a distal end away from the bonding area and an intermediate portion between the proximal end and the distal end;
    bonding an electronic element to the proximal ends of leads in the lead frame;
    providing a package body over the electronic element and at least a portion of the proximal ends of each of the leads, the package body being a first material;

providing a carrier structure over at least a portion of the distal ends of at least some of the leads, the carrier structure being of a second material different from the first material, wherein at least a portion of the intermediate portions of the leads being exposed and not covered by either material;

testing the electronic element by contacting the leads; and cutting the intermediate portions of the leads to separate the package body from the carrier structure.

17. The method of claim 16 wherein the step providing a package body of a first material provides a material of a first quality, and the step providing a carrier structure of a second material provides a material of a second quality, lower than said first quality.

18. The method of claim 16 wherein the steps of providing the package body and providing the carrier structure are performed separately in time.

19. The method of claim 16 wherein the steps of providing the package body and providing the carrier structure are performed simultaneously.

* * * * *